(12) United States Patent
Williamson et al.

(10) Patent No.: US 7,241,557 B2
(45) Date of Patent: Jul. 10, 2007

(54) PHOTOPOLYMERIZABLE COMPOSITION

(75) Inventors: Alexander Williamson, Mortsel (BE); Paul Callant, Edegem (BE)

(73) Assignee: Agfa Graphics NV, Mortsel (BE)

( * ) Notice: Subject to any disclaimer, the term of this patent is extended or adjusted under 35 U.S.C. 154(b) by 14 days.

(21) Appl. No.: 11/193,681

(22) Filed: Jul. 29, 2005

(65) Prior Publication Data

US 2006/0024614 A1 Feb. 2, 2006

Related U.S. Application Data

(60) Provisional application No. 60/601,888, filed on Aug. 16, 2004.

(30) Foreign Application Priority Data

Jul. 30, 2004 (EP) .................... 04103670

(51) Int. Cl.
*G03F 7/031* (2006.01)
(52) U.S. Cl. ............... 430/284.1; 430/281.1; 430/285.1; 430/288.1; 430/283.1; 430/302; 430/926
(58) Field of Classification Search ................ 430/926
See application file for complete search history.

(56) References Cited

U.S. PATENT DOCUMENTS

| | | | |
|---|---|---|---|
| 3,784,557 A | 1/1974 | Cescon | |
| 3,980,713 A | 9/1976 | Matsunaga et al. | |
| 4,250,248 A | 2/1981 | Faust | |
| 4,274,062 A | 6/1981 | Brinkmann et al. | |
| 4,410,621 A | 10/1983 | Wada et al. | |
| 4,459,349 A | 7/1984 | Tanaka et al. | |
| 4,619,998 A * | 10/1986 | Buhr | 430/281.1 |
| 4,816,379 A * | 3/1989 | Bronstert et al. | 430/306 |
| 4,987,053 A | 1/1991 | Gersdorf et al. | |
| 5,691,394 A * | 11/1997 | Kondo | 430/281.1 |
| 6,197,472 B1 | 3/2001 | Konrad et al. | |
| 6,576,396 B1 | 6/2003 | Leichsenring et al. | |
| 2003/0186165 A1 | 10/2003 | Gries et al. | |

FOREIGN PATENT DOCUMENTS

| | | |
|---|---|---|
| DE | 14 70 154 A1 | 1/1972 |
| DE | 20 64 079 A1 | 7/1972 |
| DE | 27 00 292 A1 | 7/1978 |
| DE | 28 22 190 A1 | 11/1979 |
| DE | 32 11 312 A1 | 10/1982 |
| DE | 199 15 717 A1 | 10/2000 |
| DE | 199 33 139 A1 | 1/2001 |
| EP | 0 24 629 A2 | 3/1981 |
| EP | 0 107 792 A1 | 5/1984 |
| EP | 0 215 453 A2 | 3/1987 |
| EP | 0 287 818 A2 | 10/1988 |
| EP | 0 316 706 A2 | 5/1989 |
| EP | 0 985 683 A1 | 3/2000 |
| EP | 1 035 435 A1 | 9/2000 |
| EP | 1 048 982 A1 | 11/2000 |
| EP | 1 070 990 A1 | 1/2001 |
| EP | 1 091 247 A2 | 4/2001 |
| EP | 1 349 006 A1 | 10/2003 |

OTHER PUBLICATIONS

European Search Report 04 10 3670 (Feb. 1, 2005).
Kauffman et al.; *Journal of Organic Chemistry*; 68(3); pp. 839-853 (2003).

* cited by examiner

*Primary Examiner*—Cynthia Hamilton
(74) *Attorney, Agent, or Firm*—Leydig Voit & Mayer, Ltd

(57) ABSTRACT

A composition that is photopolymerizable upon absorption of light in the wavelength range from 300 to 450 nm, the composition comprising a binder, a polymerizable compound, a sensitizer and a photoinitiator, wherein the sensitizer is a fluorene compound that is conjugated via a double or triple bond with an aromatic or heteroaromatic group, and is characterized by a high sensitivity.

21 Claims, No Drawings

PHOTOPOLYMERIZABLE COMPOSITION

CROSS-REFERENCE TO RELATED PATENT APPLICATIONS

This application claims the benefit of U.S. Provisional Application No. 60/601,888 filed Aug. 16, 2004, which is incorporated by reference. In addition, this application claims the benefit of European Application No. 04103670.8 filed Jul. 30, 2004, which is also incorporated by reference.

FIELD OF THE INVENTION

The present invention relates to a composition that is photopolymerizable upon absorption of light in the wavelength range from 300 to 450 nm, the composition comprising a binder, a polymerizable compound, a sensitizer and a photoinitiator. The invention also relates to a printing plate precursor comprising said composition and a method for making a printing plate therewith.

BACKGROUND OF THE INVENTION

In lithographic printing, a so-called printing master such as a printing plate is mounted on a cylinder of the printing press. The master carries a lithographic image on its surface and a printed copy is obtained by applying ink to said image and then transferring the ink from the master onto a receiver material, which is typically paper. In conventional, so-called 'wet' lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called 'driographic' printing, the lithographic image consists of ink-accepting and ink-abhesive (ink-repelling) areas and during driographic printing, only ink is supplied to the master.

Printing masters are generally obtained by the so-called computer-to-film (CtF) method wherein various pre-press steps such as typeface selection, scanning, color separation, screening, trapping, layout and imposition are accomplished digitally and each color selection is transferred to graphic arts film using an image-setter. After processing, the film can be used as a mask for the exposure of an imaging material called plate precursor and after plate processing, a printing plate is obtained which can be used as a master. Since about 1995, the so-called 'computer-to-plate' (CtP) method has gained a lot of interest. This method, also called 'direct-to-plate', bypasses the creation of film because the digital document is transferred directly to a plate precursor by means of a so-called plate-setter. A plate precursor for CtP is often called a digital plate.

Digital plates can roughly be divided in three categories: (i) silver plates, which work according to the silver salt diffusion transfer mechanism; (ii) photopolymer plates which contain a photopolymerizable composition that hardens upon exposure to light and (iii) thermal plates of which the imaging mechanism is triggered by heat or by light-to-heat conversion. Thermal plates are mainly sensitized for infrared lasers emitting at 830 nm or 1064 nm. Typical photopolymer plates are sensitized for visible light, mainly for exposure by an Ar laser (488 nm) or a FD-YAG laser (532 nm). The wide-scale availability of low cost blue or violet laser diodes, originally developed for data storage by means of DVD, has enabled the production of plate-setters operating at shorter wavelength. More specifically, semiconductor lasers emitting from 350 to 450 nm have been realized using an InGaN material.

Photopolymer plates sensitized for the wavelength range from 350 to 450 nm have also been described in the prior art. Photopolymer plates generally contain a polymerizable monomer, a binder, a photoinitiator and a sensitizing dye. EP-A 985683 describes a composition comprising a titanocene compound as photoinitiator and specific dyes as sensitizers for the wavelength range from 350 to 450 nm. EP-A 1035435 discloses a 1,3-dihydro-1-oxo-2H-indene derivative as sensitizing dye. EP-A 1048982 and EP-A 1070990 also discloses certain dyes in combination with a titanocene photoinitiator. A wide range of dyes for the wavelength range from 300 to 1200 nm is disclosed in EP-A 1091247. The sensitizing dyes disclosed in the prior art do not produce sufficient speed (sensitivity) to enable a short exposure time with the commercially available blue or violet laser diodes, which have a light output characterized by low power.

From EP-A 1349006 is known a composition using optical brightheners, that can be exposed with violet laser diodes, but even higher speeds are desirable to further shorten the exposure time and to further decrease the power requirement of the laser diodes. In addition it is desirable to find an alternative for the sensitizers disclosed in EP-A 1349006.

SUMMARY OF THE INVENTION

It is an object of the present invention, to further increase the sensitivity of compositions that are photopolymerizable upon absorption of light in the wavelength range between 300 and 450 nm.

It is a further object of the present invention, to find an alternative sensitizer for photopolymerizable compositions, that has a high sensitisation efficiency. The objects of the present invention are surprisingly realized by a photopolymerizable composition, wherein the sensitizer is a substituted fluorene compound having at least two substituents, and wherein said two substituents comprise at least a total of 16 pi-electrons that are in conjugation with the pi-electrons of the fluorene ring system. A substituent that comprises pi-electrons that are in conjugation with the fluorene ring system, is called a pi-substituent in the following and the accordingly substituted fluorene compound of the present invention is called a conjugated fluorene compound.

When said photopolymerizable composition is coated on a suitable support, a printing plate precursor according to the present invention is obtained that is sensitive to the wavelength range from 300 to 450 nm. The printing plate precursor of the present invention is a flexographic or lithographic printing plate precursor, the latter being highly preferred. Also a method of making a printing plate wherein said printing plate precursor is exposed with light comprising radiation in the wavelength range from 300 to 450 nm, is an aspect of the present invention. Preferred photopolymer plate precursors according to the present invention can be exposed with an energy density, measured on the surface of the plate of 100 µJ/cm$^2$ or less.

Preferred embodiments of the composition, of the printing plate precursor and of the method of making a printing plate according to the present invention are defined in the dependent claims.

DETAILED DESCRIPTION OF THE INVENTION

The present invention relates to a composition that is photopolymerizable upon absorption of light in the wavelength range from 300 to 450 nm, preferably from 380 to 430 nm, the composition comprising a binder, a polymerizable compound, a sensitizer and a photoinitiator, characterised in that the sensitizer is a fluorene compound that is conjugated via a double or triple bond with an aromatic or heteroaromatic group.

The photopolymerizable composition according to the present invention is characterized by a higher sensitivity than the known materials without any known disadvantages and allows the use of low power low cost laser diodes.

The sensitizer used for the present invention has at least two pi-substituents, that together comprise at least a total of 16 pi-electrons that are in conjugation with the pi-electrons of the fluorene ring system. To make possible the conjugation, said pi-substituents are bound to positions 1 to 8 of the fluorene ring system. Preferably one of said two pi-substituents is bound to position 2 and the other to position 7 of the fluorene ring system and each of said two pi-substituents comprises at least 8 pi-electrons that are in conjugation with the pi-electrons of the fluorene ring system.

The term "pi-electron" as used for the characterization of the sensitizers of the present invention means a) electrons that are localized in orbitals perpendicular to the atom-atom bonds and b) free electron pairs. For carbon, nitrogen and oxygen atoms pi-electrons usually are located in p-orbitals.

The terms "conjugated" or "in conjugation with" as used for the characterization of the sensitizers of the present invention, is commonly known for systems having alternating sequences of single and multiple bonds and/or atoms with a free electron pair and multiple bonds. The pi-electrons of e.g. two double bonds separated by a single bond are said to be conjugated, if the geometry of the molecule allows an overlap of the orbitals of the two double bonds, so that their four pi-electrons are delocalised. In particular the geometry is such that the molecular part that has a conjugated (delocalized) pi-electron system has a planar basic molecular skeleton.

The fluorene ring system and its numbering is demonstrated with the following formula:

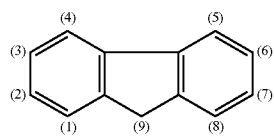

In a preferred embodiment of the present invention the sensitizer has a pi-substituent comprising a linking group with a carbon-carbon double or triple bond that links the fluorene ring system with an aryl or heteroaryl (hetaryl) group. The linking group can also comprise more than one conjugated double bond, as long as conjugation is possible from the pi-electrons of the fluorene ring system to the aryl or heteroaryl group of the pi-substituent. Preferably the pi-substituent is selected from the groups -L-aryl or -L-heteroaryl, wherein L means an alkenylene or alkynylene group and particularly preferred an ethenylene (vinylene) or ethynylene (—CC—) group. For the pi-substituents preferred aryl groups are phenyl groups and preferred hetaryl groups are six ring heterocycles like pyridinyl groups and five ring heterocycles. Examples for preferred sensitizers according to the present invention are distyrylfluorene compounds, diheteroaryl vinylfluorene compounds and diarylethynyl fluorene compounds.

In a particular preferred embodiment of the present invention the sensitizer has a structure according to one of formulae (I), (II) or (III):

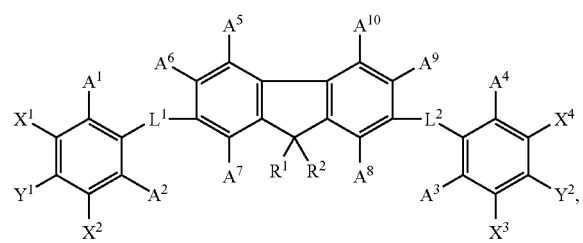

(I)

wherein $A^1$ to $A^{10}$, $X^1$ to $X^4$ and $Y^1$, $Y^2$ mutually independent mean a substituent selected from a non-metallic atom group, $L^1$, $L^2$ mutually independent mean a linking group selected from —$CR^3$=$CR^4$— or ethynylene and $R^1$ to $R^4$ mutually independent mean a substituent selected from a non-metallic atom group, and wherein one or more pairs of said substituents can jointly mean the remaining atoms to form a ring,

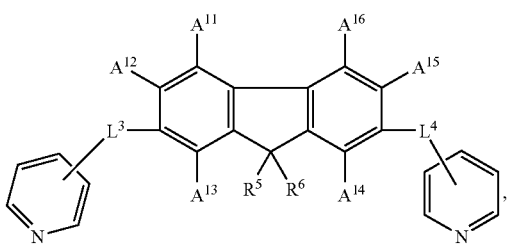

(II)

wherein $A^{11}$ to $A^{16}$ mutually independent mean a substituent selected from a non-metallic atom group, $L^3$, $L^4$ mutually independent mean a linking group selected from —$CR^7$=$CR^8$— or ethynylene and $R^5$ to $R^8$ mutually independent mean a substituent selected from a non-metallic atom group, wherein the pyridinyl groups are unsubstituted or substituted by one to four substituents selected from a non-metallic atom group, L3, L4 are bond to a carbon atom of the pyridyl group, and wherein one or more pairs of said substituents can jointly mean the remaining atoms to form a ring, or

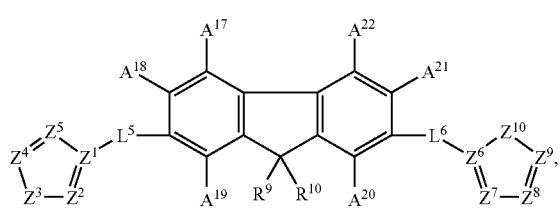

(III)

wherein $A^{17}$ to $A^{22}$ mutually independent mean a substituent selected from a non-metallic atom group, $L^5$, $L^6$ mutually independent mean a linking group selected from —$CR^{11}$=$CR^{12}$— or ethynylene, $R^9$ to $R^{12}$ mutually independent mean a substituent selected from a non-metallic atom group, $Z^1$ to $Z^4$ and $Z^6$ to $Z^9$ mutually independent mean nitrogen or carbon atoms that can be unsubstituted or can be substituted by a substituent selected from a non-metallic atom group, $Z^5$, $Z^{10}$ mutually independent mean O, S, C, $CR^{13}$, $CR^{14}R^{15}$ or $NR^{16}$ and $R^{13}$ to $R^{16}$ mutually independent mean a substituent selected from a non-metallic atom group, and wherein one or more pairs of said substituents can jointly mean the remaining atoms to form a ring.

The non-metallic atom group according to the present invention preferably consists of a hydrogen atom or alkyl, alkenyl, alkynyl, aryl, heterocyclyl, hydroxy, carboxy, carbalkoxy, halogeno, alkoxy, aryloxy, heterocyclyloxy, alkylthio, arylthio, heterocyclylthio, alkylseleno, arylseleno, heterocyclylseleno, acyl, acyloxy, alkylsulfonyl, aminosulfonyl, acylamino, cyano, nitro, amino or mercapto groups, wherein heterocycle means a saturated, unsaturated or aromatic heterocycle and acyl means the remaining residue of an aliphatic, olefinic or aromatic carbon, carbaminic, sulfonic, amidosulfonic or phosphonic acid.

In a preferred embodiment of the present invention the non-metallic atom group consists of a hydrogen atom or alkyl, alkenyl, aryl, heterocyclyl, hydroxy, carboxy, carbalkoxy, halogeno, alkoxy, aryloxy, heterocyclyloxy, alkylthio, arylthio, heterocyclylthio, acyl, acyloxy, acylamino, cyano, nitro, amino, or mercapto groups, wherein heterocycle has the same meaning as given above and acyl means the remaining residue of an aliphatic, olefinic or aromatic carbon, sulfonic, amidosulfonic or phosphonic acid.

Alkyl, alkylene, alkenyl, alkenylene, alkynyl and alkynylene groups according to the present invention can be linear (straight chain), branched or cyclic.

The alkyl, alkylene, alkenyl, alkenylene, alkynyl, alkynylene, aryl, heterocyclyl, alkoxy and alkylthio groups of the present invention can be optionally substituted by a substituent selected from the non-metallic atom group of the present invention and the substituents can be selected to adjust the solubility of the sensitizer and preferably may be halogeno, alkoxy, alkylthio, carbalkoxy, acyloxy or hydroxy.

Said one or more pairs of substituents that jointly can mean the remaining atoms to form a ring preferably are selected from $A^1$ with $X^1$; $X^1$ with $Y^1$; $Y^1$ with $X^2$; $X^2$ with $A^2$; $A^3$ with $X^3$; $X^3$ with $Y^2$; $Y^2$ with $X^4$; $X^4$ with $A^4$; $A^5$ with $A^6$; $R^1$ with $R^2$; $A^9$ with $A^{10}$; $A^1$, $A^2$, $A^6$ or $A^7$ with $R^3$ or $R^4$ of $L^1$; $A^3$, $A^4$, $A^8$ or $A^9$ with $R^3$ or $R^4$ of $L^2$; $A^{11}$ with $A^{12}$; $A^{15}$ with $A^{16}$; $A^{12}$ or $A^{13}$ with $R^7$ or $R^8$ of $L^3$; $A^{14}$ or $A^{15}$ with $R^7$ or $R^8$ of $L^4$; $A^{17}$ with $A^{18}$; $A^{21}$ with $A^{22}$; $A^{18}$ or $A^{19}$ with $R^{11}$ or $R^{12}$ of $L^5$; and $A^{20}$ or $A^{21}$ with $R^{11}$ or $R^{12}$ of $L^6$.

In a particular preferred embodiment of the present invention, said one or more pairs of substituents that jointly can mean the remaining atoms to from a ring are selected from $R^1$ with $R^2$; $A^1$, $A^2$, $A^6$ or $A^7$ with $R^3$ or $R^4$ of $L^1$; $A^3$, $A^4$, $A^8$ or $A^9$ with $R^3$ or $R^4$ of $L^2$; $A^{12}$ or $A^{13}$ with $R^7$ or $R^8$ of $L^3$; $A^{14}$ or $A^{15}$ with $R^7$ or $R^8$ of $L^4$; $A^{18}$ or $A^{19}$ with $R^{11}$ or $R^{12}$ of $L^5$; and $A^{20}$ or $A^{21}$ with $R^{11}$ or $R^{12}$ of $L^6$.

A ring according to the present invention means a carbo- or heterocyle, that can be substituted by substituents selected from e.g. the non-metallic atom group of the present invention, that can be saturated, unsaturated or aromatic and that itself can be substituted by further rings. Preferably the ring is a 5 to 8 membered ring, and in particular a 5 or 6 membered ring.

In a further preferred embodiment of the present invention the sensitizer has a structure according to one of formulae (I), (II) or (III), wherein $L^1$, $L^2$ mutually independent mean —$CR^3$=$CR^4$—; $L^3$, $L^4$ mutually independent mean —$CR^7$=$CR^8$—; and $L^5$, $L^6$ mutually independent mean —$CR^{11}$=$CR^{12}$—. In this embodiment it is particularly preferred, when $R^3$, $R^4$, $R^7$, $R^8$, $R^{11}$ and $R^{12}$ mean a hydrogen atom.

In another preferred embodiment of the present invention the sensitizer has a structure according to one of formulae (I), (II) or (III), wherein $A^1$ to $A^{22}$ mean hydrogen, and/or $X^1$ to $X^4$ mutually independent mean a substituent selected from hydrogen, alkoxy or alkylthio, and/or $Y^1$, $Y^2$ mutually independent mean a substituent selected from alkoxy or alkylthio, and/or $R^1$, $R^2$, $R^5$, $R^6$, $R^9$, $R^{10}$ mutually independent mean straight chain or branched alkyl and/or $L^1$ to $L^6$ mean —CH=CH—.

Further advantages with respect to the sensitivity can be achieved with sensitizers of the following general formulae (I-A) and/or (I-B):

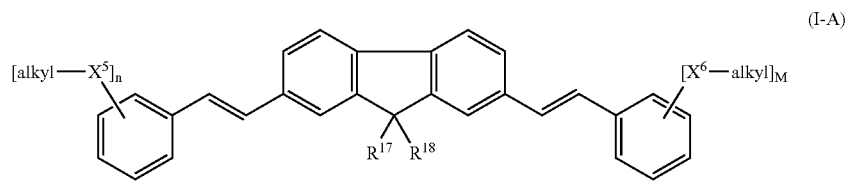

(I-A)

-continued (I-B)

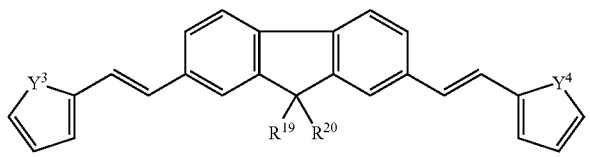

wherein the alkyl groups mutually independent mean an unsubstituted linear or branched alkyl group having 1 to 20 carbon atoms and preferably having 1 to 10 carbon atoms,
$X^5$ and $X^6$ mutually independent mean O or S, preferably O,
n, m mutually independent mean an integer from 1 to 3, preferably 3,
$Y^3$, $Y^4$ mutually independent mean O, S, NH or N-alkyl, preferably O or S,
$R^{17}$ to $R^{20}$ mutually independent mean an unsubstituted linear or branched alkyl group having 1 to 20 carbon atoms and preferably having 1 to 10 carbon atoms, and wherein the substituents alkyl-$X^5$ and alkyl-$X^6$ are bound at positions 3 and/or 4 and/or 5 of the phenylrings respectively. In the case where n and/or m are 1, the single substituent is preferably bound at position 4 (para position) of the phenyl ring concerned.

Further advantages with respect to the sensitivity can be achieved with symmetrical sensitizers. A symmetrical sensitizer according to the present invention means a compound of formula (I), wherein $A^1=A^4$, $A^2=A^3$, $A^6=A^9$, $A^5=A^{10}$, $A^7=A^8$, $X^1=X^4$, $X^2=X^3$, $Y^1=Y^2$, $R^1=R^2$, and $L^1=L^2$; a compound of formula (II), wherein $A^{11}=A^{16}$, $A^{12}=A^{15}$, $A^{13}=A^{14}$, $R^5=R^6$, $L^3=L^4$ and wherein the two pyridyl rings have the same substitution; or a compound of formula (III), wherein $A^{17}=A^{22}$, $A^{18}=A^{21}$, $A^{19}=A^{20}$, $R^9=R^{10}$, $L^5=L^6$ and wherein the two 5 ring heterocycles have the same substitution.

Sensitizers of structures (I) and (III) are preferred over those of structure (II) and sensitizers of structure (I) are particularly preferred.

The following structures are examples of preferred sensitizers of the present invention:

(I-1)

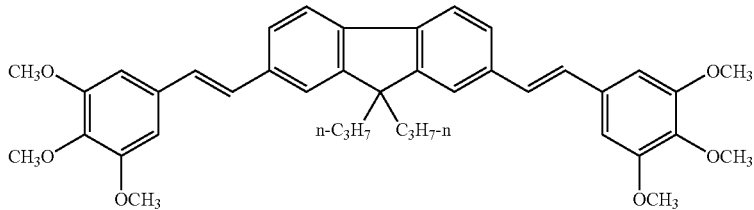

(I-2)

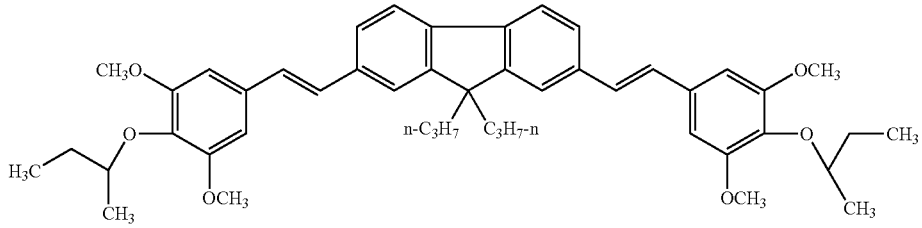

(I-3)

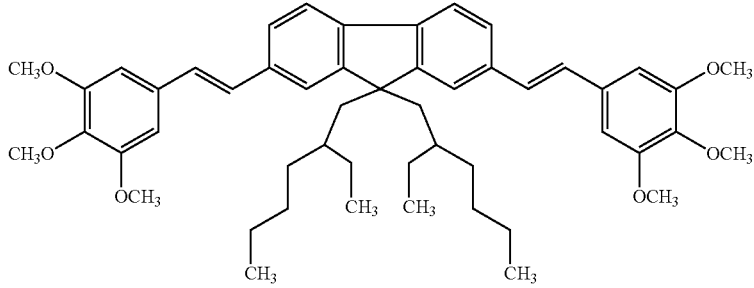

(I-4)

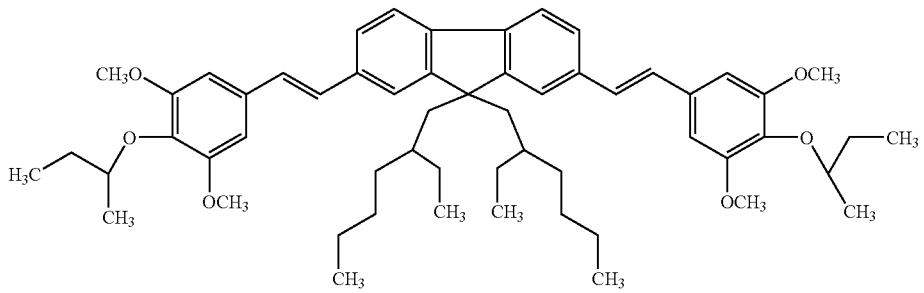

(I-5)

(I-6)    (III-1)

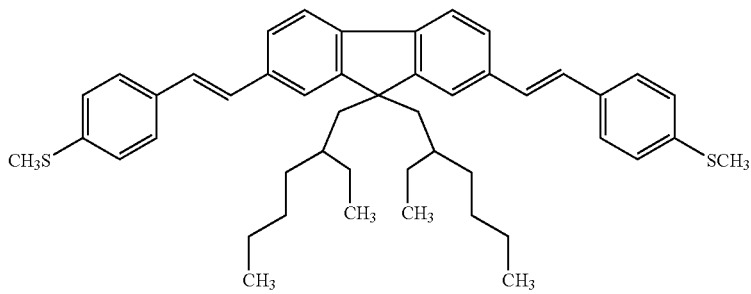

The sensitizer of the present invention can be used as a single compound or as a mixture of compounds of formulae (I) and/or (II) and/or (III). The overall amount of these compounds ranges from 0.1 to 10% by weight, preferably 0.5 to 8% by weight with respect to the total weight of the non-volatile compounds in the composition. The sensitizer of the present invention can also be combined with known sensitizers.

The sensitizers useful for the present invention preferably have a good solubility in common solvents. It has been found, that such sensitizers are particularly advantageous, that have a solubility of 0.5 g, in particular 1.5 g sensitzer per 100 mL methylethylketone or more.

In a preferred embodiment of the present invention, the composition is photopolymerizable upon absorption of light in the wavelength range from 350 to 430 nm, preferably from 380 to 430 nm and in particular from 390 to 420 nm.

The sensitizers useful for the present invention can be synthesised by known methods, e.g. as described in J. M. Kauffman, G. Moyna, J. Org. Chem., 2003, 68, p. 839–853 and particularly preferred the synthesis can be done in analogy to the synthesis of sensitizer (I-2) as described in the following.

Synthesis of Sensitizer I-2

Step 1: 9,9-Dipropylfluorene (2)

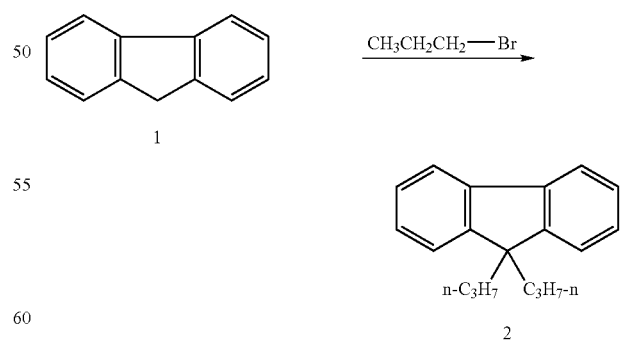

To a solution of fluorene (1) (41.5 g) in dimethylformamide (300 mL) at 20° C. was added sodium hydride (24.7 g) in portions. The red solution was stirred for 2 hours at 35° C. until no more gas was evolved. To this solution was added 1-bromopropane (62.7 g) drop-wise over 1 hour at 5° C. and then the mixture was stirred for 1 hour at 40° C.

The suspension was poured into ice-water (1.5 L) and the resultant oil was dissolved in methylene chloride (0.5 L). The organic phase was washed with water, dried over magnesium sulfate and the solvent was removed under reduced pressure. The residue was purified by vacuum distillation (122–125° C./0.5 mmHg). After cooling, 2 was obtained as a crystalline product (47.0 g, 74%).

Step 2: 2,7-Bis(bromomethyl)-9,9-dipropylfluorene (3)

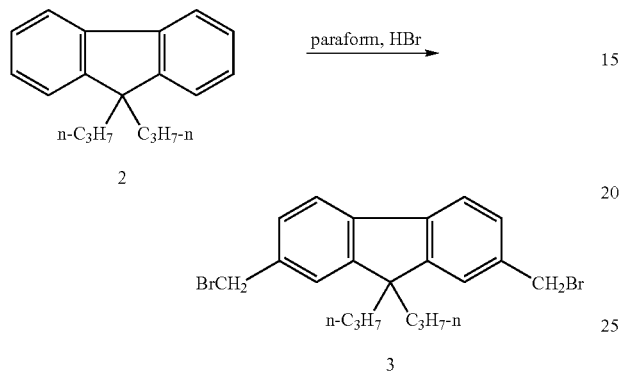

To a solution of 9,9-dipropylfluorene 2 (25.0 g) in acetic acid (50 mL) was added paraformaldehyde (paraform) (18.0 g) at 15° C. To the mixture was then added a solution of hydrogen bromide in acetic acid (250 mL, 30% w/w) over 0.5 hours, and the solution was stirred at 60° C. for 5 hours. The reaction mixture was poured into ice-water (1.0 L) and stirred for 0.5 hours. The precipitate was filtered off and purified by stirring in acetonitrile (200 mL) at 40° C., filtering and drying to give 3 as a yellow powder (33.g, 77%).

Step 3: 2,7-Bis(diethylphosphofonatomethyl)-9,9-dipropylfluorene (4)

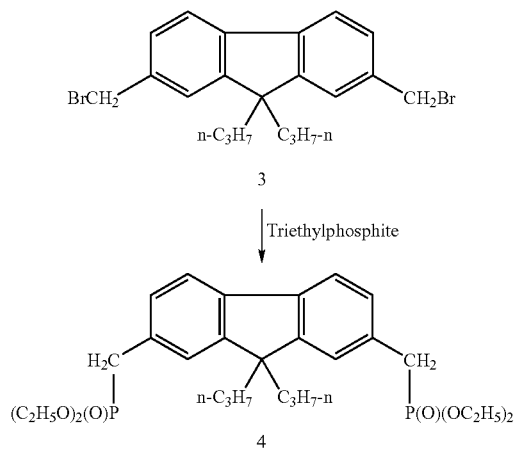

A mixture of 2,7-Bis(bromomethyl)-9,9-dipropylfluorene (3) (33.0 g) and triethylphosphite (40 mL) was stirred for 3 hours at 150° C. Excess triethylphosphite was removed at reduced pressure at 100° C. and the resultant oil crystallized from hexane. After drying, 4 was obtained as a white powder (31.5 g, 67.5%).

Step 4: Sensitizer I-2

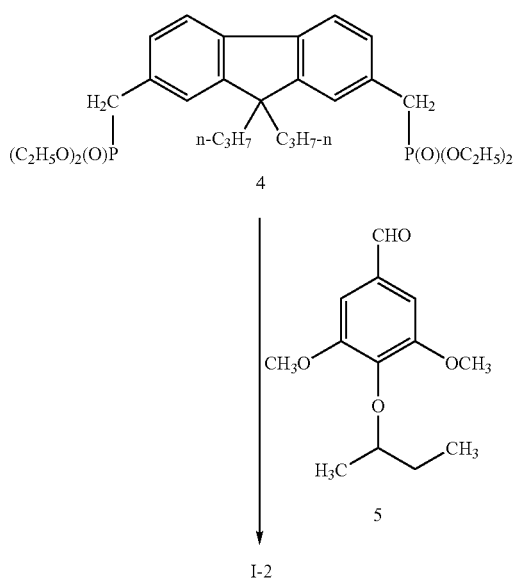

To a solution of 2,7-Bis(diethylphosphofonatomethyl)-9,9-dipropylfluorene (4) (26.8 g) and 3,5-dimethoxy-4-(1-methylpropoxy)-benzaldehyde (5) (26.2 g) in tetrahydrofuran (200 mL) was added potassium hydroxide (8.4 g) and dimethylsulfoxide (5.0 mL). The suspension was stirred at 70° C. for 4 hours and then isopropanol (150 mL) was added. The solvent of the supernatant solution was removed at reduced pressure and the resultant oil was stirred in methanol (200 mL). The precipitate was filtered off and purified by stirring in boiling ethanol (200 mL) two times. After drying, I-2 was obtained as a yellow powder (25.8 g, 72%).

The known photopolymerization initiators can be used in the composition of the present invention. Suitable classes include aromatic ketones, aromatic onium salts, organic peroxides, thio compounds, hexaarylbisimidazole compounds, ketooxime ester compounds, borate compounds, azinium compounds, metallocene compounds, active ester compounds and compounds having a carbon-halogen bond. Many specific examples of such photoinitiators can be found in EP-A 1091247.

Good results, in particular high sensitivity, can be obtained by the combination of a sensitizer according to the present invention and a hexaarylbisimidazole (HABI, dimer of triaryl-imidazole) as photoinitiator.

A procedure for the preparation of HABIs is described in DE 1470 154 and their use in photopolymer-izable compositions is documented in EP 24 629, EP 107 792, U.S. Pat. No. 4,410,621, EP 215 453 and DE 3 211 312. Preferred derivatives are e.g. 2,4,5,2',4',5'-hexaphenylbisimidazole, 2,2'-bis(2-chlorophenyl)-4,5,4',5'-tetraphenylbisimidazole, 2,2'-bis(2-bromophenyl)-4,5,4',5'-tetraphenylbisimidazole, 2,2'-bis(2,4-dichlorophenyl)-4,5,4',5'-tetraphenylbisimidazole, 2,2'-bis(2-chlorophenyl)-4,5,4',5'-tetrakis(3-methoxyphenyl)bisimidazole, 2,2'-bis(2-chlorophenyl)-4,5,4',5'-tetrakis(3,4,5-trimethoxyphenyl)-bisimidazole, 2,5,2',5'-tetrakis(2-chlorophenyl)-4,4'-bis(3,4-dimethoxyphenyl) bisimidazole, 2,2'-bis(2,6-dichlorophenyl)-4,5,4',5'-tetraphenylbisimidazole, 2,2'-bis(2-nitrophenyl)-4,5,4',5'-tetraphenylbisimidazole, 2,2'-di-o-tolyl-4,5,4',5'-tetraphenylbisimidazole, 2,2'-bis(2-ethoxyphenyl)-4,5,4',5'- tetraphenylbisimidazole and 2,2'-bis(2,6-difluorophenyl)-4,5,4',5'-tetraphenylbisimidazole. The amount of the HABI photoinitiator typically ranges from 0.01 to 30% by weight, preferably from 0.5 to 20% by weight, relative to the total weight of the non volatile components of the photopolymerizable composition.

The binder can be selected from a wide series of organic polymers. Compositions of different binders can also be used. Useful binders include for example chlorinated polyalkylenes in particular chlorinated polyethylene and chlorinated polypropylene; poly(methacrylic acid) alkyl esters or alkenyl esters in particular poly(methyl (meth)acrylate), poly(ethyl (meth)acrylate), poly(butyl (meth)acrylate), poly (isobutyl (meth)acrylate), poly(hexyl (meth)acrylate), poly ((2-ethylhexyl) (meth)acrylate) and poly(alkyl (meth)acrylate); copolymers of (meth)acrylic acid alkyl esters or alkenyl esters with other copolymerizable monomers, in particular with (meth)acrylonitrile, vinyl chloride, vinylidene chloride, styrene and/or butadiene; poly(vinyl chloride) (PVC); vinylchloride/(meth)acrylonitrile copolymers; poly(vinylidene chloride) (PVDC); vinylidene chloride/(meth)acrylonitrile copolymers; poly(vinyl acetate); poly(vinyl alcohol); poly (meth)acrylonitrile; (meth)acrylonitrile/styrene copolymers; (meth)acrylamide/alkyl (meth) acrylate copolymers; (meth)acrylonitrile/butadiene/styrene (ABS) terpolymers; polystyrene; poly($\alpha$-methylstyrene); polyamides; polyurethanes; polyesters; cellulose or cellulose compounds like methyl cellulose, ethyl cellulose, acetyl cellulose, hydroxy-($C_{1-4}$-alkyl)cellulose, carboxymethyl cellulose; poly(vinyl formal) and poly(vinyl butyral). Particularly suitable are binders that are insoluble in water, but on the other hand are soluble or at least swellable in aqueous-alkaline solutions. Further effective binders are polymers that are soluble in common organic coating solvents.

Particular suitable for the purpose of the present invention are binders containing carboxyl groups, in particular polymers or copolymers containing monomeric units of $\alpha,\beta$-unsaturated carboxylic acids and/or monomeric units of $\alpha,\beta$-unsaturated dicarboxylic acids, preferably acrylic acid, methacrylic acid, crotonic acid, vinylacetic acid, maleic acid or itaconic acid. By the term "copolymers" are to be understood in the context of the present invention polymers containing units of at least 2 different monomers, thus also terpolymers and higher mixed polymers. Particular useful examples of copolymers are those containing units of (meth) acrylic acid and units of alkyl (meth)acrylates, allyl (meth) acrylates and/or (meth)acrylonitrile as well as copolymers containing units of crotonic acid and units of alkyl (meth) acrylates and/or (meth)acrylonitrile and vinylacetic acid/ alkyl (meth)acrylate copolymers. Also suitable are copolymers containing units of maleic anhydride or maleic acid monoalkyl esters. Among those are, for example, copolymers containing units of maleic anhydride and styrene, unsaturated ethers or esters or unsaturated aliphatic hydrocarbons and the esterification products obtained from such copolymers. Further suitable binders are products obtainable from the conversion of hydroxyl-containing polymers with intramolecular dicarboxylic anhydrides. Further useful binders are polymers in which groups with acid hydrogen atoms are present, some or all of which are converted with activated isocyanates. Examples of these polymers are products obtained by conversion of hydroxyl-containing polymers with aliphatic or aromatic sulfonyl isocyanates or phosphinic acid isocyanates. Also suitable are polymers with aliphatic or aromatic hydroxyl groups, for example copolymers containing units of hydroxyalkyl (meth)acrylates, allyl alcohol, hydroxystyrene or vinyl alcohol, as well as epoxy resins, provided they carry a sufficient number of free OH groups.

The organic polymers used as binders have a typical mean molecular weight $M_w$ between 600 and 200 000, preferably between 1 000 and 100 000. Preference is further given to polymers having an acid number between 10 to 250, preferably 20 to 200, or a hydroxyl number between 50 and 750, preferably between 100 and 500. The amount of binder(s) generally ranges from 10 to 90% by weight, preferably 20 to 80% by weight, relative to the total weight of the non-volatile components of the composition.

The polymerizable compound can be selected from a wide series of photo-oxidizable compounds. Suitable compounds contain primary, secondary and in particular tertiary amino groups. Radically polymerizable compounds containing at least one urethane and/or urea group and/or a tertiary amino group are particularly preferred. By the term "urea group" has to be understood in the context of the present invention a group of the formula >N—CO—N<, wherein the valences on the nitrogen atoms are saturated by hydrogen atoms and hydrocarbon radicals (with the proviso that not more than one valence on either of the two nitrogen atoms is saturated by one hydrogen atom). However, it is also possible for one valence on one nitrogen atom to be bonded to a carbamoyl (—CO—NH—) group, producing a biuret structure.

Also suitable are compounds containing a photo-oxidizable amino, urea or thio group, which may be also be a constituent of a heterocyclic ring. Compounds containing photo-oxidizable enol groups can also be used. Specific examples of photo-oxidizable groups are triethanolamino, triphenylamino, thiourea, imidazole, oxazole, thiazole, acetylacetonyl, N-phenylglycine and ascorbic acid groups. Particularly suitable compounds are monomers containing photo-oxidizable groups corresponding to the following formula (XVIII):

$$R_{(m-n)}Q[(-CH_2-CR^1R^2-O)_a-CO-NH-(X^1-NH-CO-O)_b-X^2-(O-CO-CR^3=CH_2)_c]_n \quad (XVIII)$$

wherein

R represents an alkyl group having 2 to 8 carbon atoms (($C_2$–$C_8$) alkyl group), a ($C_2$–$C_8$) hydroxyalkyl group or a ($C_6$–$C_{14}$) aryl group, Q represents

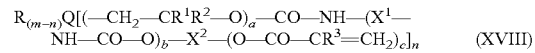

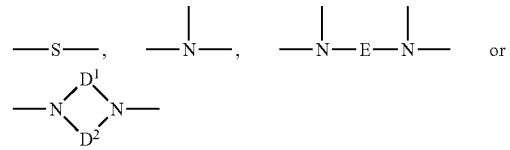

wherein

E represents a divalent saturated hydrocarbon group of 2 to 12 carbon atoms, a divalent 5- to 7-membered, saturated iso- or heterocyclic group, which may contain up to 2 nitrogen, oxygen and/or sulfur atoms in the ring, a divalent aromatic mono- or bicyclic isocyclic group of 6 to 12 carbon atoms or a divalent 5- or 6-membered aromatic heterocyclic group; and $D^1$ and $D^2$ independently represent a saturated hydrocarbon group of 1 to 5 carbon atoms, $R^1$ and $R^2$ independently represent a hydrogen atom, an alkyl or alkoxyalkyl group, $R^3$ represents a hydrogen atom, a methyl or ethyl group, $X^1$ represents a straight-chained or branched saturated hydrocarbon group of 1 to 12 carbon atoms, $X^2$ represents a (c+1)-valent hydrocarbon group in which up to 5 methylene groups may have been replaced by oxygen atoms, a is an integer from 0 to 4, b is 0 or 1, c is an integer from 1 to 3, m is an integer from 2 to 4 and n is an integer from 1 to m.

Compounds of this nature and processes for their preparation are described in EP 287 818. If a compound of general formula (XVIII) contains several radicals R or several radicals according to the structure indicated between square brackets, i.e. if (n−m)>1 and n>1, these radicals can be identical or different from one another. Compounds according to formula (XVIII) wherein n=m are particularly preferred. In this case, all radicals contain polymerizable groups. Preferably, the index a is 1; if several radicals are present, a cannot be 0 in more than one radical. If R is an alkyl or hydroxyalkyl group, R generally contains 2 to 6, particularly 2 to 4 carbon atoms. Aryl radicals R are in general mononuclear or binuclear, preferably however mononuclear, and may be substituted with ($C_1$–$C_5$) alkyl or ($C_1$–$C_5$) alkoxy groups. If $R^1$ and $R^2$ are alkyl or alkoxy groups, they preferably contain 1 to 5 carbon atoms. $R^3$ is preferably a hydrogen atom or a methyl group. $X^1$ is preferably a straight-chained or branched aliphatic and/or cycloaliphatic radical of preferably 4 to 10 carbon atoms. In a preferred embodiment, $X^2$ contains 2 to 15 carbon atoms and is in particular a saturated, straight-chained or branched aliphatic and/or cycloaliphatic radical containing this amount of carbon atoms. Up to 5 methylene groups in these radicals may have been replaced by oxygen atoms; in the case of $X^2$ being composed of pure carbon chains, the radical generally has 2 to 12 carbon atoms, preferably 2 to 6 carbon atoms. $X^2$ can also be a cycloaliphatic group of 5 to 10 carbon atoms, in particular a cyclohexane diyl group. The saturated heterocyclic ring formed by $D^1$, $D^2$ and both nitrogen atoms generally has 5 to 10 ring members in particular 6 ring members. In the latter case the heterocyclic ring is preferably a piperazine and the radical derived therefrom a piperazine-1,4-diyl radical. In a preferred embodiment, radical E is an alkane diyl group which normally contains about 2 to 6 carbon atoms. Preferably the divalent 5- to 7-membered, saturated, isocyclic group E is a cyclohexane diyl group, in particular a cyclohexane-1,4-diyl group. The divalent, isocyclic, aromatic group E is preferably an ortho-, meta- or para-phenylene group. The divalent 5- or 6-membered aromatic heterocyclic group E, finally, contains preferably nitrogen and/or sulphur atoms in the heterocyclic ring. c is preferably 1, i.e. each radical in the square bracket generally contains only one polymerizable group, in particular only one (meth)acryloyloxy-group.

The compounds of formula (XVIII) wherein b=1, which accordingly contain two urethane groups in each of the radicals indicated in the square brackets, can be produced in a known way by conversion of acrylic esters or alkacrylic esters which contain free hydroxyl groups with equimolar amounts of diisocyanates. Excess isocyanate groups are then, for example, reacted with tris(hydroxyalkyl)amines, N,N'-bis(hydroxyalkyl) piperazines or N,N,N',N'-tetrakis (hydroxyalkyl)alkylenediamines, in each of which individual hydroxyalkyl groups may have been replaced by alkyl or aryl groups R. If a=0, the result is a urea grouping. Examples of the hydroxyalkylamine starting materials are diethanolamine, triethanolamine, tris(2-hydroxypropyl) amine, tris(2-hydroxybutyl)amine and alkyl-bis-hydroxyalkylamines. Examples of suitable diisocyanates are hexamethylene diisocyanate, 2,2,4-trimethylhexamethylene diisocyanate, 1,4-cyclohexylene diisocyanate (=1,4-diisocyanatocyclohexane) and 1,1,3-trimethyl-3-isocyanatomethyl-5-isocyanatocyclohexane. The hydroxy-containing esters used are preferably hydroxyethyl (meth)acrylate, hydroxypropyl (meth)acrylate and hydroxyisopropyl (meth)acrylate.

The polymerizable compounds of formula (XVIII) wherein b=0 are prepared converting the above-described hydroxyalkylamino compounds with isocyanate-containing acrylic or alkacrylic esters. A preferred isocyanate-containing ester is isocyanoto-ethyl (meth)acrylate.

Further polymerizable compounds comprising photooxidisable groups suitable for the purpose of the invention are compounds according to the following formula (XIX):

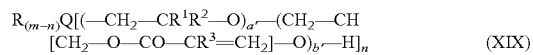

$$R_{(m-n)}Q[(-CH_2-CR^1R^2-O)_{a'}-(CH_2-CH[CH_2-O-CO-CR^3=CH_2]-O)_{b'}-H]_n \quad (XIX)$$

wherein a' and b' independently represent integers from 1 to 4 and Q, $R^1$, $R^2$, $R^3$, n and m have the same meaning as above and Q can also be a group of the formula >N-E'-N< wherein the radical E' corresponds to the following formula (XX):

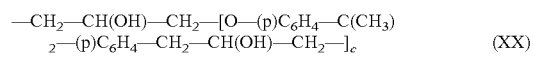

$$-CH_2-CH(OH)-CH_2-[O-(p)C_6H_4-C(CH_3)_2-(p)C_6H_4-CH_2-CH(OH)-CH_2-]_c \quad (XX)$$

wherein c has the same meaning as in formula (I) and $(p)C_6H_4$ represents para-phenylene.

The compounds of formula (XIX) are prepared analogously to those of formula (XVIII), except that the conversion products of hydroxyalkyl acrylates or alkacrylates and diisocyanates are replaced by the corresponding acrylic and alkacrylic glycide esters. Compounds of formula (XX) and processes to their preparation are disclosed in EP 316 706.

Further useful polymerizable compounds containing photooxidisable groups are acrylic and alkacrylic esters of the following formula (XXI):

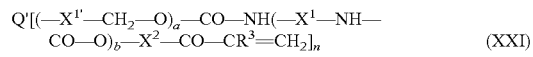

$$Q'[(-X^{1'}-CH_2-O)_a-CO-NH(-X^1-NH-CO-O)_b-X^2-CO-CR^3=CH_2]_n \quad (XXI)$$

wherein

Q' represents

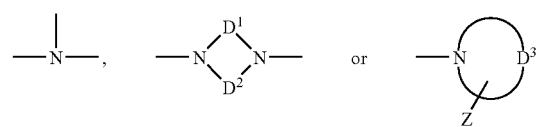

wherein $D^1$ and $D^2$ indepently represent a saturated hydrocarbon group of 1 to 5 carbon atoms and $D^3$ represents a saturated hydrocarbon group of 4 to 8 carbon atoms, which together with the nitrogen atom forms a 5- or 6-membered heterocyclic ring;

$X^{1'}$ represents —$C_iH_{2i}$— or

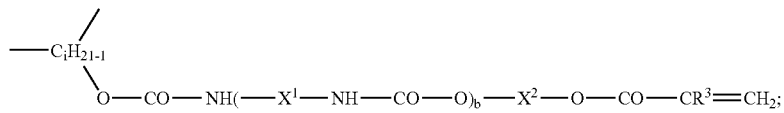

Z represents a hydrogen atom or a radical of the following formula:

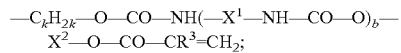

i,k independently represent integers from 1 to 12;

n' represents an integer from 1 to 3; and a is 0 or 1; provided that a is 0 in at least one of the radicals bonded to Q;

$X^1$, $R^3$, a and b have the same meaning as given in the above formula (VIII); and $X^2$ represents a divalent hydrocarbon group in which up to 5 methylene groups may be replaced by oxygen atoms.

In formula (XXI) index a is preferably 0 or 1 and i preferably represents a number between 2 and 10. Preferred radicals Q are piperazine-1,4-diyl ($D^1=D^2=CH_2-CR_2$), piperidine-1-yl ($D^3=(CH_2)_5$, Z=H) and 2-(2-hydroxyethyl)-piperidine-1-yl ($D^3=(CH_2)_5$, Z=$CH_2CH_2OH$).

Of the compounds of formula (XXI), those which apart from a urea group contain at least one urethane group are preferred. Here again, by the term "urea group" has to be understood the group of formula >N—CO—N< already mentioned above. Compounds of formula (XXI) and processes for their preparation are disclosed in EP 355 387.

Also suitable polymerizable compounds are reaction products of mono- or diisocyanates with multifunctional alcohols, in which the hydroxy groups are partly or completely esterified with (meth)acrylic acid. Preferred compounds are materials, which are synthesized by the reaction of hydroxyalkyl-(meth)acrylates with diisocyanates. Such compounds are basically known and for instance described in DE 28 22 190 and DE 20 64 079.

The amount of polymerizable compound comprising photooxidisable groups generally ranges from 5 to 75% by weight, preferably from 10 to 65% by weight, relative to the total weight of the non volatile compounds of the photopolymerizable composition.

Moreover, the composition can contain polyfunctional (meth)acrylate or alkyl(meth)acrylate compounds as crosslinking agents. Such compounds contain more than 2, preferably between 3 and 6 (meth)acrylate and/or alkyl (meth)acrylate groups and include in particular (meth)acrylates of saturated aliphatic or alicyclic trivalent or polyvalent alcohols such as trimethylol ethane, trimethylol propane, pentaerythritol or dipentaerythritol.

The total amount of polymerizable compounds generally ranges from about 10 to 90% by weight, preferably from about 20 to 80% by weight, relative to the total weight of the non volatile components of the photopolymerizable composition of the present invention.

The following specific example is also a suitable polymerizable compound:

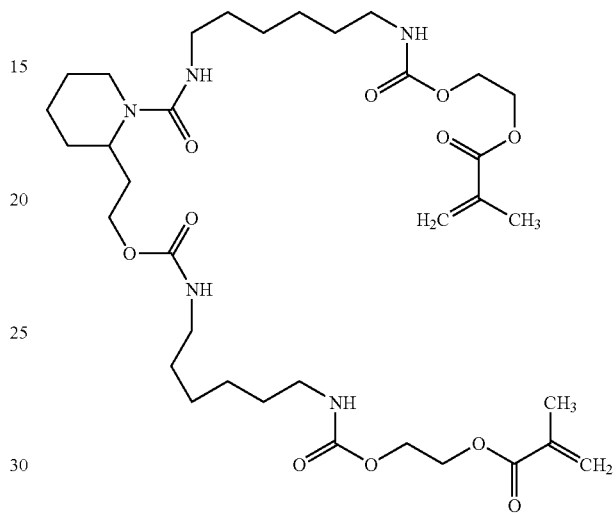

In order to achieve a high sensitivity, it is advantageous to add a radical chain transfer agent as described in EP 107 792 to the photopolymerizable composition of the present invention. The preferred chain transfer agents are sulfur containing compounds, especially thiols like e.g. 2-mercaptobenzothiazole, 2-mercaptobenzoxazole or 2-mercaptobenzimidazole. The amount of chain transfer agent generally ranges from 0.01 to 10% by weight, preferably from 0.1 to 2% by weight, relative to the total weight of the non volatile components of the photopolymerizable composition.

Optionally pigments, e.g. predispersed phthalocyanine pigments, can be added to the composition of the present invention for dyeing the composition and the layers produced therewith. Their amount generally ranges from about 1 to 15% by weight, preferably from about 2 to 7% by weight related to the total weight of the non volatile components of the composition. Particularly suitable predispersed phthalocyanine pigments are disclosed in DE 199 15 717 and DE 199 33 139. Preference is given to metal-free phthalocyanine pigments.

In order to adjust the photopolymerizable composition according to the present invention to specific needs, thermal inhibitors or stabilizers for preventing thermal polymerization may be added. Furthermore additional hydrogen donors, dyes, colored or colorless pigments, color formers, indicators and plasticisers may be present. These additives are convieniently selected so that they absorb as little as possible in the actinic range of the imagewise applied radiation.

The present invention also relates to a photopolymer printing plate precursor comprising a layer (photopolymerizable layer) containing the photopolymerizable composition of the present invention on a support.

The photopolymerizable composition according to the present invention is applied to the support by processes which are known per se to the person skilled in the art. In general, the components of the photopolymerizable composition are dissolved or dispersed in an organic solvent or solvent mixture, the solution or dispersion is applied to the intended support by pouring on, spraying on, emersion, roll application or in a similar and the solvents are removed during the subsequent drying.

The known supports can be used for the photopolymer printing plate of the present invention, like e.g. foils, tapes or plates made of metal or plastics and in the case of screen-printing also of Perlon gauze. Preferred metals are aluminium, aluminium alloys, steel and zinc, aluminium and aluminium alloys being particularly preferred. Preferred plastics are polyester and cellulose acetates, polyethyleneterephthalate (PET) being particularly preferred.

In most cases it is preferred, to treat the surface of the support mechanically and/or chemically and/or electrochemically to optimally adjust the adherence between the support and the photosensitive coating and/or to reduce the reflection of the imagewise exposed radiation on the surface of the support (antihalation).

The most preferred support to be used for the present invention is made of aluminium or an aluminium alloy, its surface is electrochemically roughened, thereafter anodize and optionally treated with a hydrophilizing agent like e.g. poly(vinylphosphonic acid).

The printing plate precursors of the present invention preferably have a protective layer (overcoat layer) provided on top of the photopolymerizable layer.

Said protective layer may contain the ingredients known in the art, in particular water soluble polymers like poly (vinyl alcohols) or poly(vinyl pyrrolidone), surface wetting agents, coloring agents, complexants and biocides. Among said complexants, ethoxylated ethylene diamine compounds have been found to be particularly preferred for the present invention.

Preferably the protective overcoat according to the present invention comprises at least one type of poly(vinyl alcohol), wherein the mean degree of saponification is less than 93 mol-%.

The degree of saponification is related to the production of poly(vinyl alcohols). As the monomer of poly(vinyl alcohol), vinyl alcohol, is nonexistent, only indirect methods are available for the production of poly(vinyl alcohol). The most important manufacturing process for poly(vinyl alcohol) is the polymerization of vinyl esters or ethers, with subsequent saponification or transesterification. The preferred starting material for the poly (vinyl alcohol) of the present invention is a vinyl alcohol esterified by a mono carboxylic acid and in particular vinyl acetate, but derivatives of vinyl acetate, vinyl esters of di carboxylic acids, vinyl ethers and the like can also be used. The degree of saponification as defined for the present invention is the molar degree of hydrolysis irrespective of the process used for the hydrolysis. Pure poly (vinyl alcohol) has e.g. a degree of saponification of 100 mol-%, but commercial products often have a degree of saponification of 98 mol-%. The poly(vinyl alcohols) as preferably used for the present invention contain mainly 1,3-diol units, but may also contain small amounts of 1,2-diol units. In the partially saponified poly(vinyl alcohols) the ester or the ether group can be distributed statistically or blockwise. Preferred partially saponified poly(vinyl alcohols) of the present invention have a viscosity of a 4% aqueous solution at 20° C. of 4 to 60 mPa·s, preferably of 4 to 20 mPa·s and in particular of 4 to 10 mPa·s.

Poly(vinyl alcohols) preferred for the present invention are commercially available e.g. under the tradename Mowiol. Those products are characterised by two appended numbers, meaning the viscosity and the degree of saponification. For example, Mowiol 8-88 or Mowiol 8/88 mean a poly(vinyl alcohol) having as 4% aqueous solution at 20° C. a viscosity of ca 8mPa·s and a degree of saponification of 88mol-%. It is further preferred to use a mixture of two or more compounds. Preferably poly(vinyl alcohols) differing in viscosity as defined above and/or in saponification degree are combined. Particularly preferred are mixture of poly (vinyl alcohols) that differ in viscosity of their 4% aqueous solutions at 20° C. for at least 2 mPa·s or that differ in saponification degree for at least 5 mol-%. Most preferred are mixtures comprising at least 3 types of poly(vinyl alcohols), wherein at least two compounds differ in viscosity as defined above for at least 2 mPa·s and at least two compounds differ in saponification degree for at least 5 mol-%.

Preferably the overall mean saponification degree of all poly(vinyl alcohols) used in the protective layer has to be less than 93 mol-%. In a further preferred embodimend of the present invention said overall mean saponification degree ranges from 71 mol-% to less than 93 mol-% and in particular from 80 mol-% to 92,9 mol-%.

The overall mean saponification degree of the poly(vinyl alcohols) used in the protective overcoat of a printing plate precursor can be determined experimentally via $^{13}C$-NMR. To measure the $^{13}C$-NMR spectra, approximately 200 mg of the protective overcoat are dissolved in 1.0 ml DMSO and from this solution a 75 MHz $^{13}C$-NMR spectrum is taken, whose resonances can easily be interpreted and allow to calculate the degree of saponification (experimental values). A good correlation is obtained between said experimental values and the values known from the product specification of the poly(vinyl alcohols). The latter values are hereinafter called theoretical values of the mean saponification degree and can easily be calculated, when mixture of poly(vinyl alcohols) are used.

Preferably the poly(vinyl alcohol) of the present invention is used in 50 to 99.9 weight percent (wt. %) relative to the total weight of the non-volatile compounds of the protective overcoat. Additionally other water soluble polymers can be added to the layer such as poly(vinyl pyrrolidone), poly (ethylene oxide), gelatin, gum arabic, oxygen binding polymers with aliphatic amine groups known from EP 352 630 B1, methyl vinylether/maleic anhydride copolymers, poly (carboxylic acids), copolymers of ethylene oxide and poly (vinyl alcohol), carbon hydrates, hydroxy ethyl cellulose, acidic cellulose, cellulose, poly(arylic acid) and mixtures of these polymers.

Preferably the poly(vinyl pyrrolidone) is only used in small quantities compared to the poly(vinyl alcohol). In a preferred embodiment of the present invention poly(vinyl pyrrolidone) is used from 0 to 10 parts by weight of the poly(vinyl alcohol) used, from 0 to 3 parts by weight being particularly preferred. Most preferred no poly(vinyl pyrrolidone)compounds are used.

In addition to the poly(vinyl alcohol) of the present invention and the optional watersoluble polymers disclosed above, the known ingredients of protective layers can be used.

The protective layer has to be transparent for actinic light and preferably has a dry thickness of 0.2 to 10 g/m², 1.0 to 5 g/m² beeing particularly preferred. Preferably it is homogeneous, substantially impermeable to oxygen, waterpermeable, and can be washed off preferably with the conventional developer solutions used to form a printing relief after imagewise exposure of the photosensitive layer. Said photopolymerizable layer is removed imagewise, whereas the protective layer is removable over the entire area of the element created. The wash-off of the protective layer can be done in a separate step, but can be done during the development step as well.

The protective layer can be coated on the photosensitive layer with known techniques and the coating solution preferably contains water or a mixture of water and an organic solvent. To allow a better wetting, the coating solution preferably contains, related to the solid content, up to 10 wt. %, and particular preferred up to 5 wt. % of a surface active agent. Suitable representatives of surface active agents comprise anionic, cationic and nonionic surface active agents like sodium alkylsulfates and -sulfonates having 12 to 18 carbon atoms, an example of which is sodium dodecylsulfate, N-cetyl- and C-cetyl betaine, alkylaminocarboxylate and -dicarboxylate, and polyethylene glycols with a mean molar weight up to 400.

In addition, further functions can be added to the protective layer. For example, it can be possible to improve the safelight suitability without decreasing the sensitivity of the layer by adding a coloring agent, e.g. a water-soluble dye, that has excellent transmission to the light having a wavelength of 300 to 450 nm and that absorbs the light having a wavelength of 500 nm or more. This principle can easily be varied for different wavelengths to adjust the effective spectral sensitivity distribution of the printing plate precursor as needed.

The present invention also relates to a method of making a lithographic printing plate comprising the steps of providing a photopolymer printing plate precursor of the present invention, exposing said printing plate precursor with light comprising radiation in the wavelength range from 300 to 450 nm, preferably with a laser having an emission wavelength in the range from 300 to 450 nm, and processing the printing plate precursor in an aqueous alkaline developer.

In a preferred embodiment of the process of the present invention the exposure is done with light comprising radiation in the wavelength range from 350 to 430 nm, preferably from 380 to 430 nm, in particular from 390 to 420 nm and preferably the exposure is done with a laser having an emission wavelenth in the range from 350 to 430 nm, preferably from 380 to 430 nm, in particular in the range from 390 to 420 nm, and the exposure is carried out at an energy density, measured on the surface of the plate, of 100 $\mu J/cm^2$ or less and preferably of 80 $\mu J/cm^2$ or less.

The processing of the printing plate precursor of the present invention is done in the usual manner. After imagewise exposure a pre-heat step is performed to improve the crosslinking of the photosensitive layer. Usually the pre-heat step is then followed by the development step, wherein the complete overcoat layer and the unexposed part of the photosensitive layer are removed. The removal (wash-off) of the overcoat layer and the development of the photosensitive layer can be done in two seperate steps in this order, but can also be done in one step simultaneously. Preferably the overcoat layer is washed-off with water before the development step. What remains on the support after the development step are the exposed and thereby photopolymerized parts of the photosensitive layer. The developer solution used for the development of the exposed printing plate precursors of the present invention preferably is an aqueous alkaline solution having a pH of at least 11, a pH from 11.5 to 13.5 being particularly preferred. The developer solution can contain a small percentage, preferably less than 5 wt. %, of an organic, water-miscible solvent. To adjust the pH of the solution, an alkali hydroxide is preferably used.

Examples of preferred, additional ingredients of the developer solution comprise alone or in combination alkali phosphates, alkali carbonates, alkali bicarbonates, an organic amine compound, alkali silicates, buffering agents, complexants, defoamers, surface active agents and dyes, but the suitable ingredients are not limited to the preferred examples and further ingredients can be used.

The method of development employed is not particularly limited, and may be conducted by soaking and shaking the plate in a developer, physically removing non-image portions while being dissolved in a developer by means of e.g. a brush, or spraying a developer onto the plate so as to remove non-image portions. The time for development is selected depending upon the above method used so that the non-image portions can adequately by removed, and is optionally selected within a range of 5 seconds to 10 minutes.

After the development, the plate my be subjected to a hydrophilic treatment by means of, e.g., gum arabic optionally applied to the printing plate as the case requires (gumming step).

EXAMPLES

A. Preparation (Coating) of the Photosensitive Layer

A composition was prepared (pw=parts per weight; wt. %=weight percentage) by mixing the components as specified in table 1. This composition was divided equally into 10 portions, and to each portion was added an amount of sensitizer according to table 2. The resulting composition was coated on an electrochemically roughened and anodically oxidized aluminum sheet, the surface of which has been rendered hydrophilic by treatment with an aqueous solution of polyvinyl phosphonic acid (oxide weight 3 $g/m^2$) and was dried for 1 minute at 120° C. (circulation oven). The resulting thickness of the layer was 1.5 $g/m^2$.

TABLE 1

| Component | Parts per weight (g) |
|---|---|
| a solution containing 32.4 wt. % of a methacrylate/ methacrylic acid copolymer (ratio methylmethacrylate:methacrylic acid of 4:1 by weight; acid number: 110 mg KOH/g) in 2-butanone (viscosity 105 $mm^2/s$ at 25° C.) | 16.075 |
| a solution containing 88.2 wt. % of a reaction product from 1 mole of 2,2,4-trimethyl-hexamethylenediisocyanate and 2 moles of hydroxyethylmethacrylate (viscosity 3.30 $mm^2/s$ at 25° C.) | 14.538 |
| Heliogene blue D 7490 ® dispersion (9.9 wt. %, viscosity 7.0 $mm^2/s$ at 25° C.), trade name of BASF AG | 17.900 |
| 2,2'-bis(2-chlorophenyl)-4,4',5,5'-tetraphenyl-1,2-bisimidazole | 1.448 |
| 2-mercaptobenzothiazole | 0.068 |
| Edaplan LA 411 ® (1% in Dowanol PM ®, trade mark of Dow Chemical Company) | 2.250 |
| 2-butanone | 78.538 |
| propyleneglycol-monomethylether (Dowanol PM ®, trade mark of Dow Chemical Company) | 130.358 |

TABLE 2

| Experiment | Sensitizer | Amount of sensitizer (mmol) |
|---|---|---|
| A | 1,4-di(3,4,5-trimethoxystyryl)benzene | 0.175 |
| B | 1,4-di[3,5-dimethoxy-4-(1-methylpropoxy)styryl]benzene | 0.175 |
| C | 4,4'-di[3,5-dimethoxy-4-(1-methylpropoxy)styryl]biphenyl | 0.175 |
| D | 1,4-di[3,5-dimethoxy-4-(1-methylpropoxy)styryl]-2,3,5,6-tetrachlorobenzene | 0.175 |
| E | (I-1) | 0.175 |
| F | (I-2) | 0.175 |
| G | (I-6) | 0.175 |

On top of the photosensitive layer a solution in water with the composition as defined in table 3 was coated and was dried at 110° C. for 2 minutes.

TABLE 3

| Component | Parts by Weight (g) |
|---|---|
| partially hydrolyzed polyvinylalcohol (degree of hydrolysis 88%, viscosity 4 mPa · s in a solution of 4 wt. % at 20° C.). | 17.03 |
| partially hydrolyzed polyvinylalcohol (degree of hydrolysis 88%, viscosity 8 mPa · s in a solution of 4 wt. % at 20° C.). | 7.43 |
| fully hydrolyzed polyvinylalcohol (degree of hydrolysis 98%, viscosity 6 mPa · s in a solution of 4 wt. % at 20° C.). | 14.87 |
| CA 24 E | 0.26 |
| Metolat FC 355 | 0.38 |
| Lutensol A8 (90%) | 0.032 |
| Water | 960 |

The so formed protective overcoat had a dry thickness of 2.0 g/m$^2$.

The imaging was carried out with a Polaris XsV violet platesetter device (flat bed system) equipped with a violet laser diode emitting between 392 and 417 nm. The following imaging conditions were used Scanning speed: 1000 m/sec Variable image plane power: 0 to 10.5 mW Spot diameter: 20 μm Addressability: 1270 dpi After imaging the plate was processed in a Agfa VSP85s processor at a speed of 1.2 m/min. During the processing the plate was first heated to 110° C. (pre-heat step), next the protective overcoat was washed off and the photolayer was processed in a water based alkaline developer (Agfa PD91) at 28° C. After a water rinsing and gumming step the printing plate was ready. A 13-step exposure wedge with density increments of 0.15 was used to determine sensitivity of the plate. The results of the exposure tests are shown in table 4 as relative values, wherein the sensitivity of the plate prepared with experiment A (material A) was arbitrarily set to 100%. For example a relative sensitivity of 200% corresponds to a material that, compared to material A, only needs 50% of the exposure energy density (μJ/cm$^2$) for a complete hardening of three wedge steps (the coating is considered as being completely hardened when the density of the processed material is at least 97% of the density of a plate which has been exposed without filter).

TABLE 4

| Experiment | Relative sensitivity (%) | |
|---|---|---|
| A | 100 | comparison |
| B | 103 | comparison |
| B(2) | 99 | comparison |
| C | 77 | comparison |
| D | No image | comparison |
| E | 128 | invention |
| E(2) | 133 | invention |
| F | 141 | invention |
| F(2) | 133 | invention |
| G | 139 | invention |

It can be clearly seen that there is a significant gain in sensitivity when distyrylfluorene-type sensitizers are used Compared to the sensitizers known from the state of the art. The experiments B, E and F were run twice as B(2), E(2) and F(2). Their results demonstrate the very good reproducibility of the data.

The invention claimed is:

1. A composition that is photopolymerizable upon absorption of light in the wavelength range from 300 to 450 nm, the composition comprising a binder, a polymerizable compound, a sensitizer and a photoinitiator, wherein the sensitizer is a fluorene compound that is conjugated via a double or triple bond with an aromatic or heteroaromatic group.

2. A composition according to claim 1, wherein the fluorene ring system of said conjugated fluorene compound is substituted at positions 1 to 8 by at least two substituents that together comprise at least a total of 16 pi-electrons that are in conjugation with the pi-electrons of the fluorene ring system.

3. A composition according to claim 2, wherein said substituents are selected from the groups -L-aryl or -L-heteroaryl, and wherein L is an alkenylene or alkynylene group.

4. A composition according to claim 3, wherein L is ethenylene or ethynylene, aryl means phenyl and heteroaryl is pyridyl or an aromatic 5 ring heterocycle.

5. A composition according to claim 4, wherein at least positions 2 and 7 of the fluorene compound are substituted with one of said substituents respectively, each of said substituents comprising at least 8 pi-electrons that are in conjugation with the fluorene ring system.

6. A composition according to claim 3, wherein at least positions 2 and 7 of the fluorene compound are substituted with one of said substituents respectively, each of said substituents comprising at least 8 pi-electrons that are in conjugation with the fluorene ring system.

7. A composition according to claim 2, wherein at least positions 2 and 7 of the fluorene compound are substituted with one of said substituents respectively, each of said substituents comprising at least 8 pi-electrons that are in conjugation with the fluorene ring system.

8. A composition according to claim 1, wherein the sensitizer has a structure according to one of formulae (I), (II) or (III):

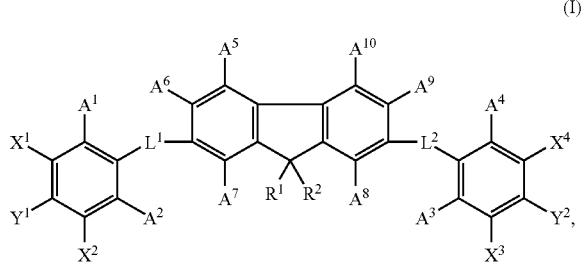

(I)

wherein
$A^1$ to $A^{10}$, $X^1$ to $X^4$, $Y^1$, and $Y^2$ are mutually independent and constitute a substituent selected from a non-metallic atom group,
$L^1$ and $L^2$ are mutually independent and constitute a linking group selected from —$CR^3$=$CR^4$— or ethynylene, and
$R^1$ to $R^4$ are mutually independent and constitute a substituent selected from a non-metallic atom group,
and wherein one or more pairs of said substituents can jointly provide the atoms needed to form a ring,

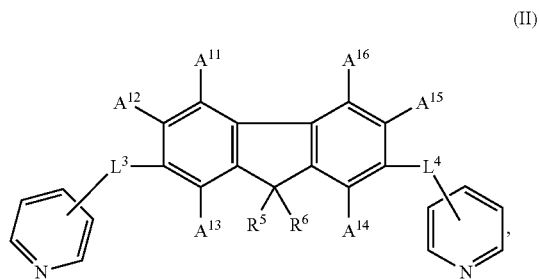

(II)

wherein
$A^{11}$ to $A^{16}$ are mutually independent and constitute a substituent selected from a non-metallic atom group,
$L^3$, $L^4$ are mutually independent and constitute a linking group selected from —$CR^7$=$CR^8$— or ethynylene and
$R^5$ to $R^8$ are mutually independent and constitute a substituent selected from a non-metallic atom group,
wherein the pyridinyl groups are unsubstituted or substituted by one to four substituents selected from a non-metallic atom group,
L3 and L4 are bonded to a carbon atom of the pyridyl group, and wherein one or more pairs of said substituents can jointly provide the atoms needed to form a ring, or

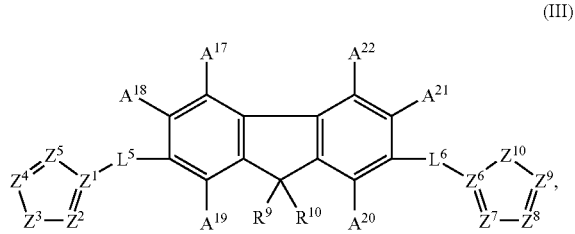

(III)

wherein
$A^{17}$ to $A^{22}$ are mutually independent and constitute a substituent selected from a non-metallic atom group,
$L^5$ $L^6$ are mutually independent and constitute a linking group selected from —$CR^{11}$=$CR^{12}$— or ethynylene,
$R^9$ to $R^{12}$ are mutually independent and constitute a substituent selected from a non-metallic atom group,
$Z^1$ to $Z^4$ and $Z^6$ to $Z^9$ are mutually independent and constitute nitrogen or carbon atoms that can be unsubstituted or can be substituted by a substituent selected from a non-metallic atom group,
$Z^5$ and $Z^{10}$ are mutually independent and constitute O, S, C, $CR^{13}$, $CR^{14}R^{15}$ or $NR^{16}$, and
$R^{13}$ to $R^{16}$ are mutually independent and constitute a substituent selected from a non-metallic atom group,
and wherein one or more pairs of said substituents can jointly provide the atoms needed to form a ring.

9. A composition according to claim 8, wherein the sensitizer has a structure according to formula (I), (II) or (III), wherein
$A^1$ to $A^{22}$ are hydrogen,
$X^1$ to $X^4$ are mutually independent and constitute a substituent selected from hydrogen, alkoxy or alkylthio,
$Y^1$ $Y^2$ are mutually independent and constitute a substituent selected from alkoxy or alkylthio and
$R^1$, $R^2$, $R^5$, $R^6$, $R^9$, $R^{10}$ are mutually independent and constitute straight chain or branched alkyl.

10. A composition according to claim 1, wherein the photoinitiator is a hexaarylbisimidazole.

11. A composition according to claim 1, wherein the binder is a polymer or copolymer comprising monomeric units of an α,β-unsaturated carboxylic acid and/or an α,β-unsaturated dicarboxylic acid.

12. A composition according to claim 1, further comprising a polyfunctional (meth)acrylate or alkyl(meth)acrylate as a crosslinking agent.

13. A composition according to claim 1, wherein the polymerizable compound contains an urethane and/or urea group and/or a tertiary amino group.

14. A composition according to claim 1, further comprising a radical chain transfer agent.

15. A composition according to claim 1, wherein the wavelength range is between 380 and 430 nm.

16. A photopolymer printing plate precursor comprising a photosensitive coating, wherein the coating comprises a composition according to claim 1.

17. A photopolymer printing plate precursor according to claim 16, wherein a protective layer is provided on top of the photosensitive coating.

18. A method of making a lithographic printing plate comprising the steps of providing a photopolymer printing plate precursor, exposing said printing plate precursor with light comprising radiation in the wavelength range from 300 to 450 nm and processing the lithographic printing plate precursor in an aqueous alkaline developer, thereby providing a photopolymer printing plate precursor according to claim 16.

19. The method according to claim 18, wherein the exposure is done with light comprising radiation in the wavelength range from 380 to 430 nm.

20. The method according to claim 18, wherein the exposure is done with a laser.

21. The method as defined in claim 18, wherein the exposure of the lithographic printing plate precursor is carried out at an energy density, measured on the plate surface, of less than 100 µJ/cm$^2$.

* * * * *